United States Patent [19]

Kraemer et al.

[11] 4,276,655
[45] Jun. 30, 1981

[54] INTEGRATED CIRCUIT PLANAR HIGH FREQUENCY MIXER

[75] Inventors: Erich H. Kraemer, Clearwater; John C. Rolfs, Palm Harbor, both of Fla.

[73] Assignee: Sperry Corporation, New York, N.Y.

[21] Appl. No.: 89,069

[22] Filed: Oct. 29, 1979

[51] Int. Cl.³ .......................... H04B 1/26; H03C 1/58
[52] U.S. Cl. ................................. 455/327; 332/43 B; 333/238; 333/246; 329/161
[58] Field of Search ............... 455/325, 326, 327, 330; 333/238, 239, 246, 247; 329/160, 161; 332/43 B, 44

[56] References Cited

U.S. PATENT DOCUMENTS

| | | | |
|---|---|---|---|
| 3,534,267 | 10/1970 | Hyltin | 455/327 |
| 3,678,395 | 7/1972 | Hunton et al. | 455/327 |
| 3,735,267 | 5/1973 | Napoli | 455/327 |
| 3,882,396 | 5/1975 | Schneider | 455/325 |
| 4,000,469 | 12/1976 | McMaster | 455/327 |
| 4,085,390 | 4/1978 | Standing | 333/247 |

Primary Examiner—Robert L. Griffin
Assistant Examiner—Tommy P. Chin
Attorney, Agent, or Firm—Howard P. Terry

[57] ABSTRACT

The invention is a cross-bar signal mixer suitable for low-cost high-yield mass production. The mixer configuration consists of a balanced planar taper section supported upon a dielectric substrate placed across the carrier and local oscillator wave guides perpendicular to the direction of electromagnetic energy propagation. Beam lead mixer diodes are connected across the feed-point of the taper section. The local oscillator energy is injected in transverse electric mode relation at the junction of the two mixer diodes, thereby effectively decoupling the local oscillator from the carrier signal input. The intermediate frequency energy is abstracted from the same point as the local oscillator energy is injected and is decoupled by a low-pass filter. The local oscillator and the intermediate frequency circuits are incorporated on the same planar substrate as the carrier signal circuit and are therefore not critical in design.

10 Claims, 7 Drawing Figures

INTEGRATED CIRCUIT PLANAR HIGH FREQUENCY MIXER

BACKGROUND OF THE INVENTION

1. Field of the Invention

The invention relates to high frequency transmission line electromagnetic signal mixers and more particularly to such signal mixer devices in which the entire mixer circuit is disposed as a planar integrated configuration mounted at right angles to the direction of input signal propagation.

2. Description of the Prior Art

In general, high frequency signal mixers, especially those designed to operate with carrier signals above 30 GHz, have been built in wave guide cavities in order to minimize losses and to permit incorporation in the structures of necessary filters. But when constructed integrally with other receiver components, the arrangement of the various interconnecting wave guides has presented formidable problems barring achievement of fully acceptable cost, package size, and system bandwidth, as well as of sufficiently low losses.

Stemming from the historical cross-bar structure for mixers, more recent balanced configurations have been realized in rectangular and ridged wave guide. Other hybrid integrated mixer designs have also been generated, using combinations of fin-line, co-planar, microstrip, and standard rectangular wave guide, and with the integrated mixer circuit disposed parallel to the direction of electromagnetic energy propagation.

In a letter to the editor in pages 450, 451 of the April 1974 issue of the *I.E.E.E. Transactions on Microwave Theory and Techniques* entitled: "Low-Noise Mixer in Oversized Microstrip for 5-mm Band", P. J. Meier disclosed a single ended signal mixer printed on a dielectric substrate disposed perpendicular to the signal propagation direction. It consists of a single-ended planar monopole detector circuit used also as a mixer by injecting the carrier signal as well as the local oscillator signal through a single rectangular wave guide across which the monopole and mixer diode are mounted.

The Meier mixer suffers from some of the problems present in the other prior art and undesirably requires a directional coupler to inject the local oscillator energy. The directional coupler increases the noise figure of the assembly because of losses inherent in the coupler. Because the local oscillator energy is injected at a considerable distance, electrically two or three wave lengths from the mixer diode, the total mixer assembly can not be truly characterized as a planar structure. Generally, the Meier device suffers from poorer isolation between the local oscillator and carrier frequency inputs. Also, suppression of local oscillator noise is inferior. In addition, the configuration is not amenable to the mounting of several mixers on one substrate or to the distribution of a local oscillator signal in a planar structure.

SUMMARY OF THE INVENTION

The invention is a cross-bar signal mixer suitable for low-cost high-yield mass production. The mixer configuration consists of a balanced planar taper section supported upon a dielectric substrate placed across the carrier and local oscillator wave guides perpendicular to the direction of electromagnetic energy propagation. Beam lead mixer diodes are connected across the feedpoint of the taper section. The local oscillator energy is injected in transverse electric mode relation at the junction of the two mixer diodes, thereby effectively decoupling the local oscillator from the carrier signal input. The intermediate frequency energy is abstracted from the same point as the local oscillator energy is injected and is decoupled by a low-pass filter. The local oscillator and the intermediate frequency circuits are incorporated on the same planar substrate as the carrier signal circuit and are therefore not critical in design.

In general, the present invention overcomes the prior art problems, is versatile, and is useful in a variety of types of electromagnetic carrier receivers, lending itself to incorporation even in complex situations, as in radar, signal seeker, and radiometer systems and in conventional and monopulse radar systems. Having truly planar configuration, it readily lends itself to fabrication by standard photo-lithographic techniques commonly used in printed circuit technology. The mixer's physical size is small and compatible for integrated assembly, minimizing losses because all circuit path lengths are minimized. Because it is truly planar nature, carrier and local oscillator matching can readily be accomplished close to the mixer diodes with the consequent reduction in transmission line dispersion effects that normally tend to limit operating band width. The novel balanced mixer configuration is also clearly preferable since it provides high isolation between the carrier and local oscillator ports, which relationship minimizes local oscillator radiation and allows fully independent matching at the individual carrier and local oscillator ports along with suppression of local oscillator noise.

DESCRIPTION OF THE PREFERRED EMBODIMENTS

Figure 1:
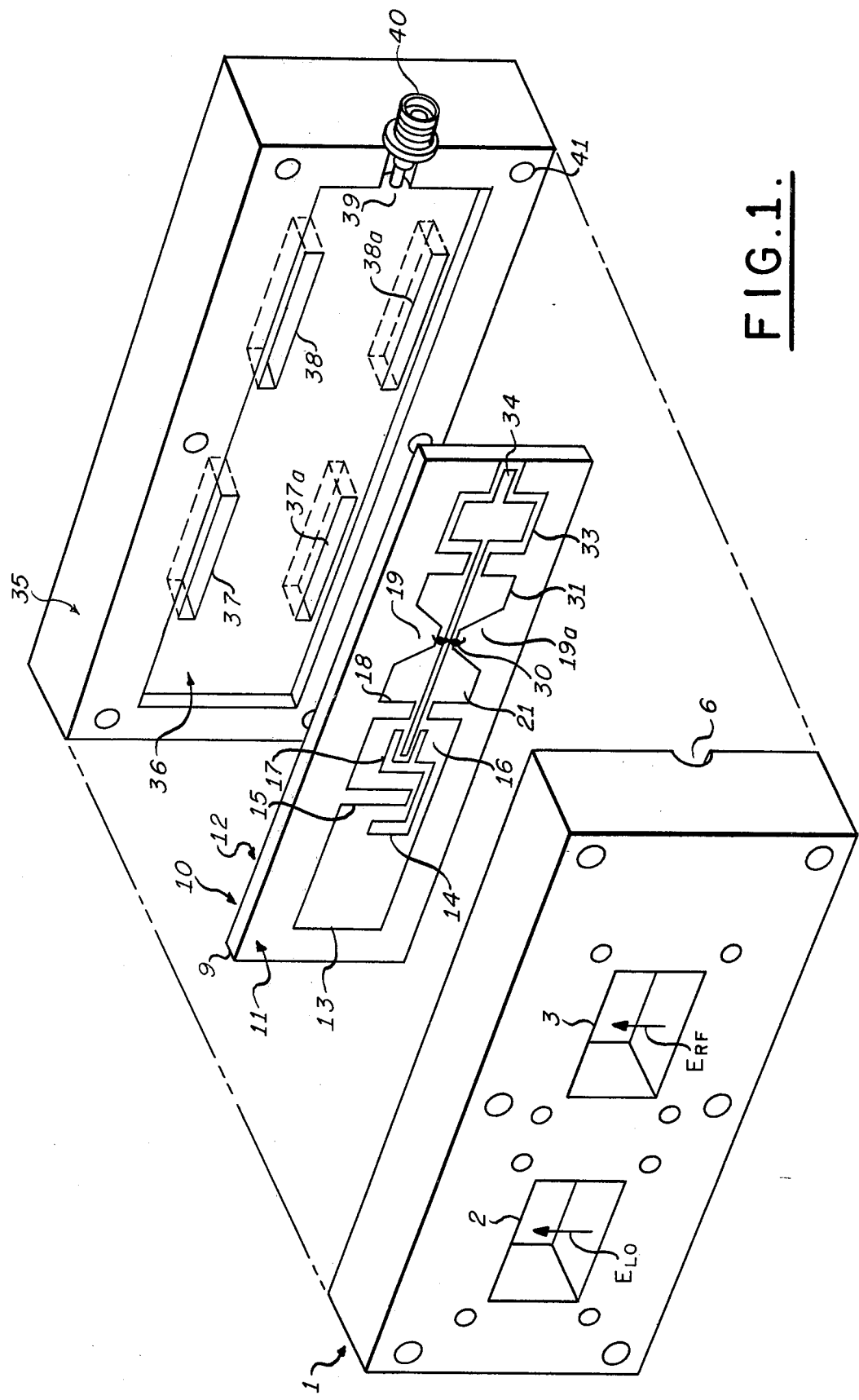
FIG. 1 is an exploded perspective view of a first embodiment of the invention.

The embodiment of the invention to be discussed in connection with FIGS. 1 through 4 is designed to receive local oscillator energy and carrier energy at one end thereof; it consists of three major elements, a local-oscillator-carrier input end piece 1, a transverse mixer circuit 10, and a reflecting end piece 35, from which assembly the intermediate frequency energy may be extracted at coaxial fitting 40. The substrate 9 upon which transverse mixer circuit 10 is located is arranged to fit closely within a thin rectangular cavity 36 in the face of reflecting end piece 35. When mixer circuit 10 is properly disposed within cavity 36, the local oscillator-carrier input end piece 1 is placed against the flush faces of elements 9 and 35 and is held there by suitable fasteners operating between the end pieces 1 and 35 at the four corners thereof, such as by bolts (not shown) passing through cooperating bores like corner bores 5 and 41. The interfacing surfaces of end pieces 1, 35 are of good electrical conductivity.

Input end piece 1 is further equipped with a pair of similar rectangular wave guide apertures 2 and 3 with electrically conducting surfaces, in which guides the respective instantaneous local oscillator field $E_{LO}$ and the instantaneous carrier field $E_{RF}$ may be set up as vectorially indicated in the drawing. Lengths of cooperating input wave guides (not shown) may be attached in alignment with guides 2, 3 in the usual manner using fastening bolts cooperating with quartets of threaded holes such as seen at 4.

The reflecting end piece 35 includes the aforementioned rectangular cavity 36 in which may be located pairs of slotted quarter wave traps 37, 37a and 38, 38a. These wave traps are aligned with respect to wave guide input apertures 2, 3 and serve to aid in reflecting all energy reaching the broad indented face of cavity 36, as will be further discussed. End pieces 1 and 35 are each supplied with halves 6 and 39 of a threaded bore for accommodating a mating conventional coaxial intermediate frequency connector 40.

Figure 3:
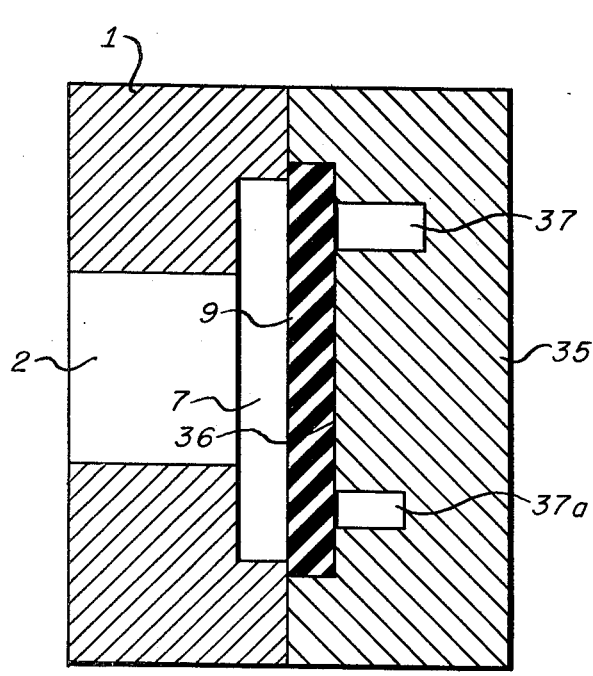
FIGS. 3 and 4 are partial cross section views taken at line 3, 4—3, 4 in FIG. 2 with successively increasing scales.

As seen in FIG. 3, the reflecting end piece 35 is equipped with the rectangular cavity 36 for accommodating transverse mixer circuit 10. Input end piece 1 is also equipped with a similar, but slightly smaller, flat cavity 7 generally coextensive with cavity 36. Cavity 7 is provided so as to prevent shorting of circuits found on the free face of substrate 9 and otherwise to prevent physical interference between parts, especially diodes 30, 30a.

The transverse mixer circuit 10 is mounted on the insulating low loss substrate 9, which may be glass. In the FIG. 1 embodiment, the entire back of substrate 9 is coated with a layer 12 of conductive material such as copper, gold, or silver laid down on the substrate back surface by any well known deposition technique.

Figure 2:
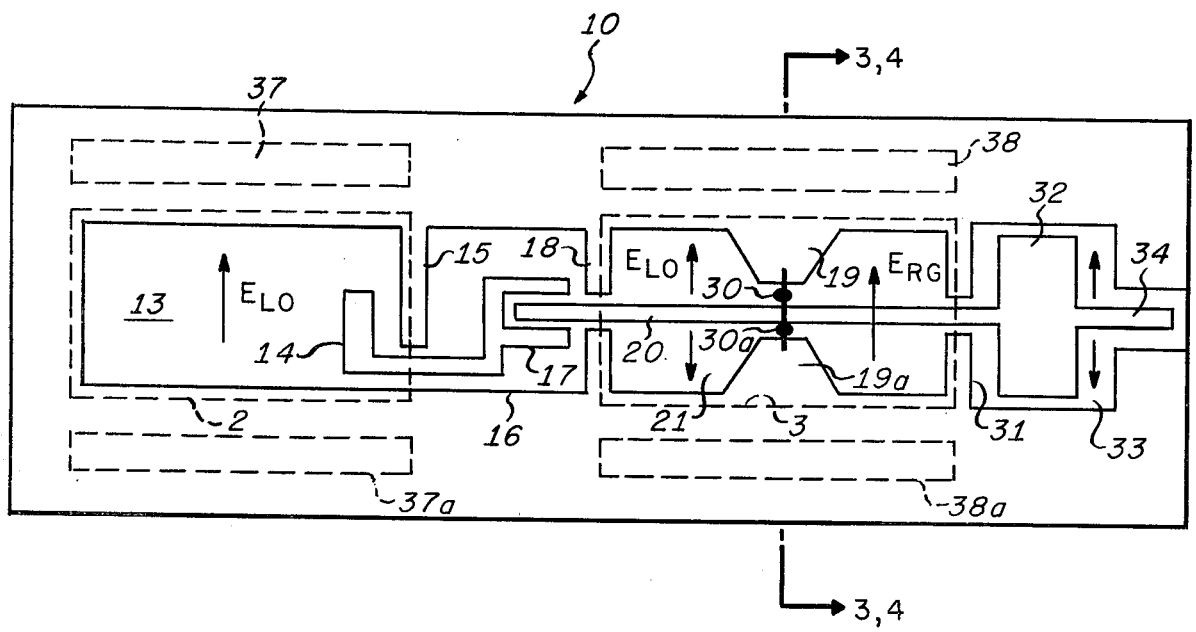
FIG. 2 is a frontal elevation view of the central component of FIG. 1 on an increased scale.
Figure 4:
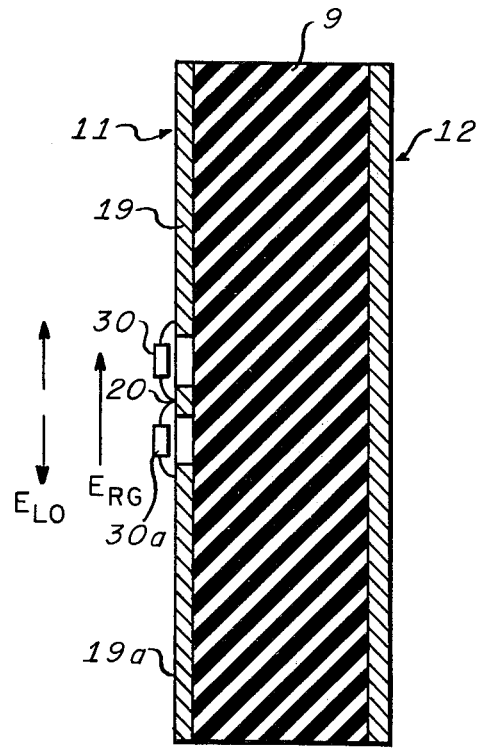

Referring also to FIGS. 2 through 4, the front surface of substrate 9 is similarly coated with an electrically conductive layer, but this frontal layer has a complex pattern of clear areas. For example, the frontal layer 11 includes a rectangular opening 13 formed by layer 11 and its projection 15 essentially to match the shape and location of wave guide 2 and disposed between the levels of quarter wave traps 37, 37a of reflecting end piece 35. The instantaneous electric field $E_{LO}$, propagating through wave guide input 2, passes through the opening 13 and is reflected by the conducting face of cavity 36. The reenforced field is coupled to the quarter wave monopole probe 14 for coupling local oscillator energy out of region 13 into local oscillator coupling circuits in an intermediate clear area 16, also defined by conductive layer 11, including projection 15 and a cooperating pair of opposed projections 18. The local oscillator coupling circuit 17 within area 16 is a conventional quarter wave long network for coupling the local oscillator energy into the balanced strip transmission line 20, but is tuned to prevent the reverse flow of intermediate frequency energy into the local oscillator wave guide 2. Line 20 functions as a balanced strip line in association with the back conducting layer 12.

The electrically conductive layer 11 has a further clear area 21 formed by layer 11 and its cooperating pairs of equal length projections 18 and 31 generally to match the shape and location of wave guide 3 and disposed between the levels of quarter wave traps 38, 38a of reflecting end piece 35. The instantaneous electric field $E_{RF}$, propagating through wave guide input 3, passes through the opening 21 and is reflected by the conducting face of cavity 36, the reenforced electric field being generated in the plane of area opening 21. Symmetrically disposed in area 21 are opposed planar tapers or truncated triangular conducting elements 19, 19a, one each side of balanced line 20. The apex of taper 19 is coupled by diode 30 to line 20, and line 20 is coupled by diode 30a to the apex of taper 19a as seen also in FIG. 4. Diodes 30, 30a are poled both to conduct instantaneously in the same direction and may be beam-lead diodes; it is now apparent that diodes 30, 30a perform their signal mixing function, being immersed in the instantaneous local oscillator and carrier fields $E_{LO}$ and $E_{RC}$ as shown particularly in FIG. 2. The intermediate frequency energy flows out of the clear area 21 along balanced transmission line 20.

A final clear area 33 is formed in layer 11 for reception of the intermediate frequency signal; it comprises an enlargement 32 in line 20 which serves to prevent flow of local oscillator or carrier energy out through the mixer output lead 34. As seen in FIG. 1, output lead 34 is conductively affixed to the inner conductor of connector 40 when the device is permanently assembled.

In operation, the carrier signal is supplied by wave guide 3 which couples that signal energy across the gap between planar tapers 19, 19a; the latter perform jointly as an impedance matching transformer for transforming the guide impedance in a broad band manner down to that associated with diodes 30, 30a. Any carrier signal energy that leaks past mixer diodes 30, 30a is largely reflected by the wall of cavity 36 of the reflecting end piece 35 directly behind diodes 30, 30a. Wave traps 38, 38a prevent the carrier energy from leaking out of cavity 36 behind the back coating 12 on substrate 9. Local oscillator energy is applied separately through the separate wave guide input 2 to the plane of the mixer circuit 10, which is everywhere perpendicular to the direction of propagation of energy into the device. Probe 14 couples the local oscillator energy to the balanced cross-bar transmission line 20. Any local oscillator energy leaking past local oscillator probe 14 is again reflected by the conducting face of cavity 36, while wave traps 37, 37a prevent leakage of energy from cavity 36. The local oscillator signal is coupled through the tuned network 17 into the common junction of line 20 and mixer diodes 30, 30a. The intermediate frequency energy is coupled away from the common junction of the mixer diodes 30, 30a by the continuation of the cross-bar conductor 20 in the direction opposite to that of the local oscillator input probe 14. The high frequency blocking filter 32 prevents any high frequency leakage energy, such as that generated by any unbalance of the mixer diodes, from propagating into the intermediate frequency output 34.

Figure 5:
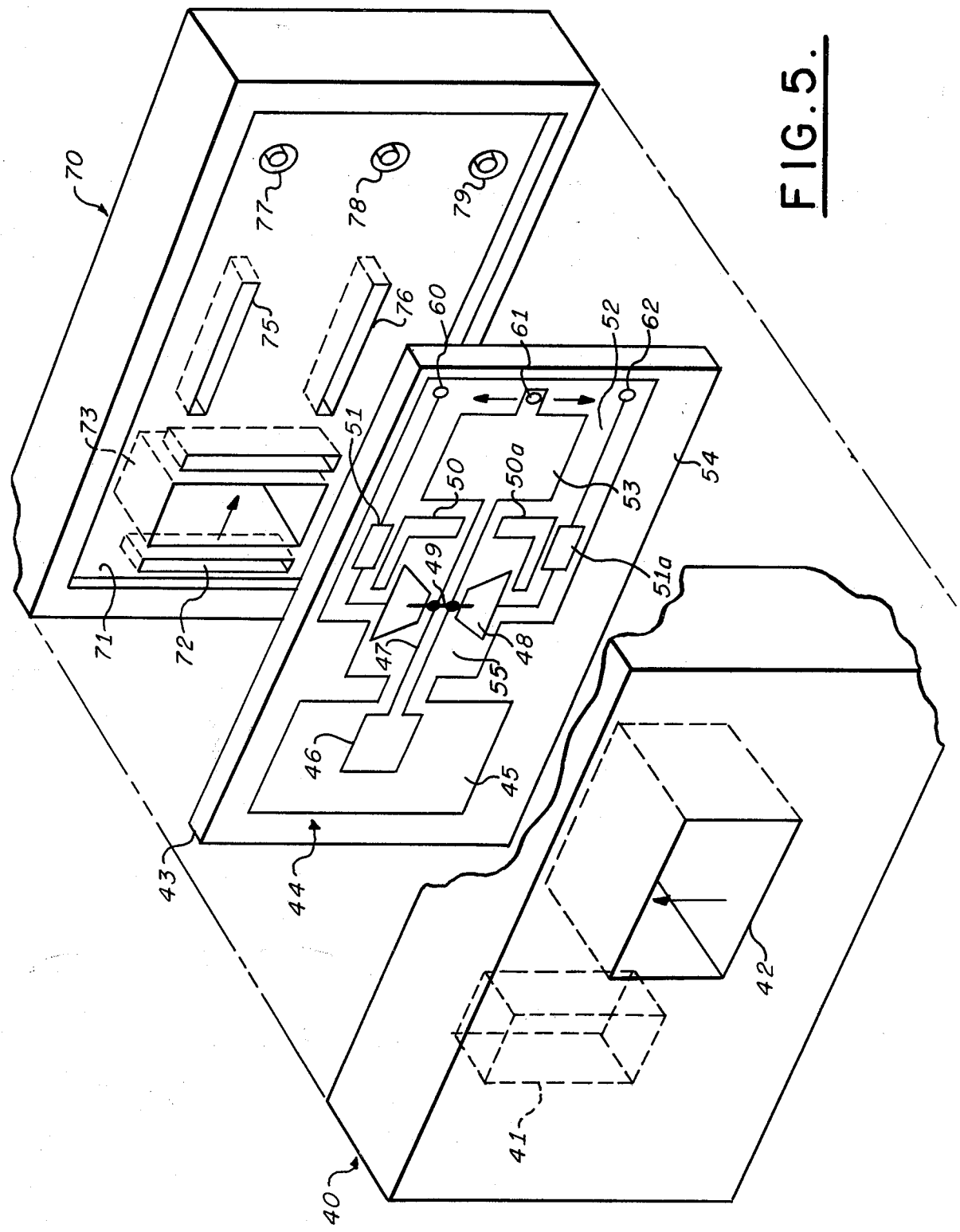
FIG. 5 is an exploded perspective view of a second embodiment of the invention.

The alternative embodiment of FIG. 5 is similar in general to that of FIGS. 1 through 4 with the major distinction that the local oscillator and carrier signal inputs are on opposite sides of the structure in place of being located on the same end piece. As a consequence, there is no continuously extending back conducting layer on the mixer circuit substrate 43 analogous to the backing layer 12 of the FIG. 1 device.

Referring further to FIG. 5, the structure includes a carrier input end piece 40 and a local oscillator input end piece 70, the latter having an inset thin rectangular cavity 71 at its inner interface for accommodating mixer circuit 44. The structure may be clamped integrally together in the manner employed in FIG. 1. Carrier input end piece 40 includes the carrier input wave guide 42 and a local oscillator matching cavity 41 whose function remains to be discussed. The configuration at the interface of carrier input end piece 40 is similar to that of FIG. 3.

The local oscillator end piece 70 is provided with quarter wave traps 75, 76 aligned therewith and spaced slightly apart from the levels of the broad walls of wave guide 42. At one end of local oscillator end piece 70 is located a trio of coaxial line fittings. The central fitting 78 provides an intermediate frequency output, while fittings 77, 79 supply individual bias voltages for the diodes at junction 49. At the opposite end of local oscillator end piece 70 is disposed the carrier energy input wave guide 73 with its wide walls perpendicular to those of carrier input wave guide 42. Spaced from the broad walls of guide 73 are quarter wave slots 72, 75 for preventing local oscillator signal leakage.

The mixer circuit 44 disposed on dielectric substrate 43 is generally similar to the mixer circuit of FIGS. 1 and 2 with certain variations. A clear area 45 in conductive layer 54 is aligned generally with the local oscillator input wave guide 73 and with the cooperating shorted cavity 41. So that the transition 17 is not needed, a horizontal and centrally disposed probe 46 is employed with a balanced line 47 leading out of area 45 into a second clear area 55 defined by layer 54 and the angular conductive layer elements 50, 50a. The generally rectangular clear area 55 thus formed is aligned with carrier input wave guide 42 of end piece 40 and chokes 75, 76 of end piece 70. Isolated truncated triangular elements or tapers 48 are found within area 55 on each side of the central balanced line 47, each taper 48 being connected to line 47 by a diode at location 49. The diodes are again poled so that they are instantaneously simultaneously both conducting. The isolated tapers 48 are respectively coupled through filters 51, 51a to contacts 60, 62. Quarter wave low pass filters 51, 51a serve to block flow of high frequency energy toward terminals 60, 62, while the blocking filter 53 performs a similar function with respect to the intermediate frequency output line 61. The input to filter 53 is located an odd number of quarter wave lengths from the mixer diodes so as to present a high impedance across the diodes at the signal frequency. It is understood that terminals 60, 61, 62 are provided with conductors (not shown) passing through dielectric substrate 43 to make respective contact with the inner conductors of fittings 77, 78, 79. Operation of the FIG. 5 embodiment is generally similar to that of FIG. 1, the FIG. 5 arrangement offering somewhat greater compactness, especially where bias inputs are not used.

The invention finds general utility in the forms shown in FIGS. 1 and 5 because of its several advantageous features. The planar printed circuit construction allows the fabrication of a large number of identical mixers on a single substrate at a minimum cost. Because of the photolithographic techniques employed, the mixer diodes and local oscillator circuits can be substantially perfectly reproduced, so that the matching of mixer diodes is easier and less expensive. Since the electrical matching of the carrier, local oscillator, and intermediate frequency circuits can be done on the substrate close to the mixer diodes, lower noise figures and larger band widths are possible. The novel integrated mixer circuit eliminates the need for complex wave guide cavities and for complex local oscillator wave guide feed networks which add to size and weight and, hence, cost. Because of the great reduction in size and the form factor of the mixer circuit, the invention may be used in a wide variety of arrangements that are required to fit in a volume too small for conventional mixer circuits.

An experimental design like that of FIG. 1 has been constructed using Hewlett-Packard type 5082-2299 beamlead diodes. The design frequency was centered at 11.8 GHz where a double side band noise figure of 6.5 dB was measured, including a 2.6 dB intermediate frequency noise figure. This is equivalent to a 5.4 double side band noise figure (for a 1.5 dB intermediate frequency contribution), as compared to a typical 4.5 dB double side band noise figure (for a 1.5 dB intermediate frequency contribution) characterizing a commercially available microstrip device.

Figure 6:
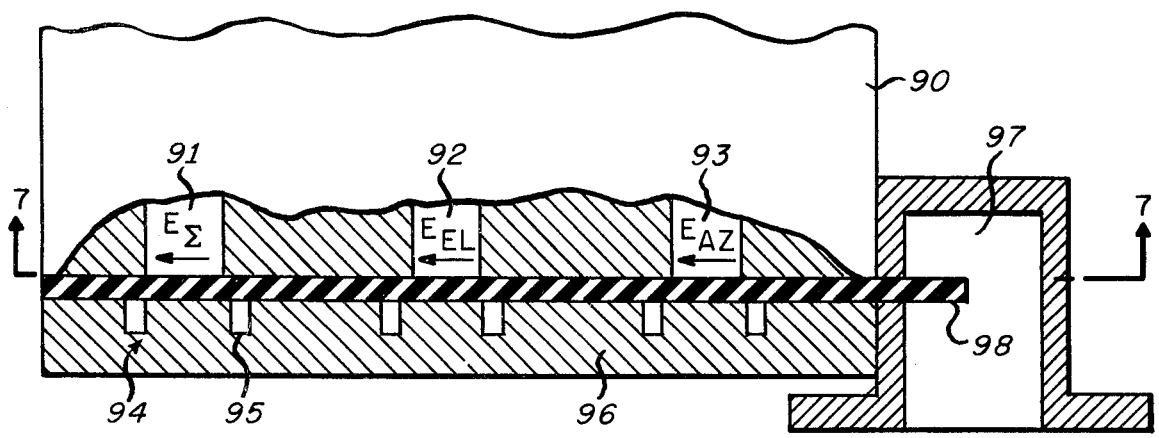
FIG. 6 is an elevation view in partial cross section showing a further application of the invention.
Figure 7:
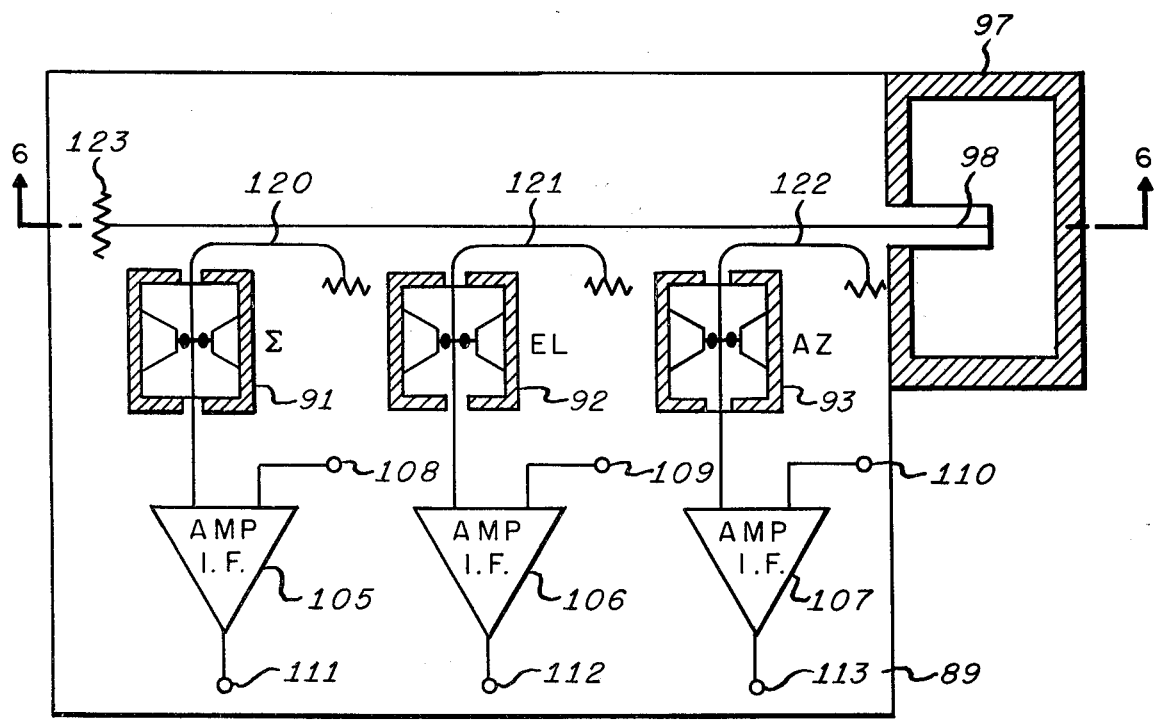
FIG. 7 is a plan view in partial cross section taken generally along the line 7—7 of FIG. 6.

FIGS. 6 and 7, by way of example, illustrate how the invention may be used in an array of planar mixers 91, 92, 93 on a single substrate 89 as part of a miniature simultaneous-lobing or monopulse receiver front end. The microwave energy input end piece 90 abutts the mixer circuit and its substrate 89 along with the respective monopulse summation, azimuth, and elevation wave guides. Opposite input end piece 90 is a reflecting end piece 96. The local oscillator wave guide 97 is disposed at one end of input end piece 90 and is coupled by probe 98 to a transmission line 122 terminated conventionally at 123. Spaced directional couplers 120, 121, 122 couple local oscillator energy via transmission lines 91, 92, 93 to the respective balanced transmission lines of the respective mixer elements 91, 92, 93. Extensions of the balanced transmission lines 120, 121, 122 respectively convey intermediate frequency signals to the respective intermediate frequency amplifiers 105, 106, 107, respectively fed by appropriate bias signals from signal sources (not shown) coupled to terminals 111, 112, 113. The advantage of the small size and simplicity of the assembly as compared to mixer systems of the prior art will be obvious to those skilled in the art.

While the invention has been described in its preferred embodiments, it is to be understood that the words which have been used are words of description rather than words of limitation and that changes may be made within the purview of the appended claims without departing from the true scope and spirit of the invention in its broader aspects.

What is claimed is:

1. High frequency signal mixer means including:
    substrate means,
    conductive layer means disposed on said substrate means and having a substantially closed pattern of at least first, second, and third clear areas,
        said first clear area having probe means for coupling electromagnetic energy of a first frequency propagating perpendicular to said first clear area for propagation, in turn, along balanced transmission line means into said second clear area,
        said second clear area being divided symmetrically by said balanced transmission line means, and
        said second clear area further including opposed conductive truncated taper means disposed symmetrically about said balanced transmission line means,
    first and second diode means respectively coupled from the apex of one of said opposed conductive truncated taper means to said balanced transmission line means and from the latter to the apex of a second of said opposed conductive truncated taper means for interaction with said energy propagating along said balanced transmission line means, said second clear area being disposed as to enable said diodes to be immersed in electromagnetic energy of a second frequency propagating perpendicular to second clear area for additional interaction with said first and second diode means, and planar filter means disposed in said third clear area and coupled to said balanced transmission line means for allowing extraction of electromagnetic energy having a difference frequency with respect to said first and second frequencies.

2. Apparatus as described in claim 1 further including a fourth clear area accommodating capacitive coupler means for coupling said probe means to said balanced transmission line means.

3. Apparatus as described in claim 1 additionally including first end piece means containing at least first wave guide means for propagating said electromagnetic energy of a first frequency.

4. Apparatus as described in claim 3 additionally including second end piece means containing second wave guide means for propagating said electromagnetic energy of said second frequency.

5. Apparatus as described in claim 3 wherein said first end piece means contains additionally second wave guide means for propagating said electromagnetic energy of said second frequency.

6. Apparatus as described in claim 5 additionally including second end piece providing reflector means for reflecting said electromagnetic energy of first and second frequencies.

7. Apparatus as described in claim 1 additionally including first and second end piece means disposed on opposed sides of said conductive layer means.

8. Apparatus as described in claim 1 wherein said probe means comprises conductive layer probe means assymetrically disposed for coupling to the electric field of said electromagnetic energy of a first frequency.

9. Apparatus as described in claim 1 wherein said probe means comprises conductive layer means symmetrically disposed for coupling to the magnetic field of said electromagnetic energy of a first frequency.

10. Apparatus as described in claim 1 wherein said opposed conductive truncated taper means are respectively coupled opposite said first and second diode means to bias conductor means.

* * * * *